United States Patent
Goto et al.

(10) Patent No.: US 10,643,514 B2
(45) Date of Patent: May 5, 2020

(54) DISPLAY DEVICE WITH INSPECTION TRANSISTOR AND METHOD FOR INSPECTING DISPLAY DEVICE

(71) Applicant: Panasonic Liquid Crystal Display Co., Ltd., Himeji-shi, Hyogo (JP)

(72) Inventors: Hiroaki Goto, Osaka (JP); Masafumi Hirata, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 16/058,557

(22) Filed: Aug. 8, 2018

(65) Prior Publication Data

US 2018/0350285 A1 Dec. 6, 2018

Related U.S. Application Data

(63) Continuation of application No. PCT/JP2017/005336, filed on Feb. 14, 2017.

(30) Foreign Application Priority Data

Feb. 29, 2016 (JP) ................................ 2016-037777

(51) Int. Cl.
*G09G 3/00* (2006.01)
*G09G 3/36* (2006.01)
(Continued)

(52) U.S. Cl.
CPC ........... *G09G 3/006* (2013.01); *G02F 1/1309* (2013.01); *G02F 1/1368* (2013.01); *G02F 1/136286* (2013.01); *G09G 3/20* (2013.01);
*G09G 3/36* (2013.01); *H01L 27/124* (2013.01); *H01L 27/1214* (2013.01); *H01L 27/1255* (2013.01);
(Continued)

(58) Field of Classification Search
CPC ..... G09G 2330/08–10; G09G 2330/12; G09G 3/006; G01R 31/44; G01R 31/2635; G02F 1/1309

See application file for complete search history.

(56) References Cited

U.S. PATENT DOCUMENTS 6,100,865 A * 8/2000 Sasaki ................. G09G 3/3648
345/92
6,115,305 A 9/2000 Pathak et al.
(Continued)

FOREIGN PATENT DOCUMENTS

JP 3-018891 1/1991
JP 5-083660 4/1993
(Continued)

*Primary Examiner* — Sanghyuk Park
(74) *Attorney, Agent, or Firm* — Hamre, Schumann, Mueller & Larson, P.C.

(57) ABSTRACT

A display device comprises: inspection transistors electrically connected to signal lines respectively; an inspection wiring through which an inspection signal is supplied to the inspection transistors; and an abnormality determination unit that determines whether the display panel is abnormal. The signal line is electrically connected to a gate electrode of the inspection transistor, and the abnormality determination unit determines whether the display panel is abnormal based on a voltage level of the inspection signal outputted from a source electrode of the inspection transistor.

7 Claims, 12 Drawing Sheets

(51) Int. Cl.
*G09G 3/30* (2006.01)
*G09G 3/20* (2006.01)
*H01L 27/12* (2006.01)
*G02F 1/1368* (2006.01)
*G02F 1/13* (2006.01)
*G02F 1/1362* (2006.01)

(52) U.S. Cl.
CPC ............ *G02F 2001/136254* (2013.01); *G09G 2330/12* (2013.01)

(56) References Cited

U.S. PATENT DOCUMENTS

| | | | |
|---|---|---|---|
| 6,656,563 B1 | 12/2003 | Leach et al. | |
| 7,053,649 B1 | 5/2006 | Osada | |
| 2004/0103503 A1 | 6/2004 | Leach et al. | |
| 2004/0108620 A1 | 6/2004 | Leach et al. | |
| 2006/0192752 A1 | 8/2006 | Ando | |
| 2006/0202923 A1 | 9/2006 | Osada | |
| 2007/0236244 A1 | 10/2007 | Ando | |
| 2009/0225067 A1* | 9/2009 | Yoda | G09G 3/006 345/211 |
| 2015/0015820 A1* | 1/2015 | Masutani | G02F 1/136286 349/42 |
| 2015/0269910 A1* | 9/2015 | Liao | G09G 5/18 345/213 |
| 2017/0249883 A1* | 8/2017 | Tanahara | G09G 3/006 |

FOREIGN PATENT DOCUMENTS

| | | |
|---|---|---|
| JP | 2003-502787 | 1/2003 |
| JP | 2004-199054 | 7/2004 |
| JP | 2005-043661 | 2/2005 |
| JP | 2005-345547 | 12/2005 |
| JP | 2011-123162 | 6/2011 |
| WO | 2007/037043 | 4/2007 |

* cited by examiner

DISPLAY DEVICE WITH INSPECTION TRANSISTOR AND METHOD FOR INSPECTING DISPLAY DEVICE

CROSS-REFERENCE TO RELATED APPLICATION

This application is a bypass continuation of international patent application PCT/JP2017/005336, filed: Feb. 14, 2017 designating the United States of America, the entire disclosure of which is incorporated herein by reference.

TECHNICAL FIELD

The present disclosure relates to a display device and a method for inspecting a display device.

BACKGROUND

Sometimes defects caused by disconnection of a data line or a gate line, a short circuit, a failure of a transistor, and the like may be generated in a display device manufacturing process. Conventionally, a technique of detecting the defect in the manufacturing process has been proposed. For example, in a technique disclosed in Unexamined Japanese Patent Publication No. 2005-345547, image data is written in a pixel, a transistor is turned off, any voltage is applied to the data line to bring the data line into a high impedance state, and the transistor is turned on to detect a change in potential of the data line, whereby the defects in a substrate is inspected.

SUMMARY

However, in the above conventional technique, although the defect in the display device manufacturing process can be detected, the defect that can be generated during normal use after a shipment.

The present disclosure provides a display device and a display device inspection method capable of detecting the defect during the normal use.

To solve the above problem, a display device according to a present disclosure comprises: a plurality of signal lines arranged in a display region of a display panel; a plurality of inspection transistors each of which has a drain electrodes, a source electrode and a gate electrode electrically connected to a corresponding one of the plurality of signal lines; an inspection wiring through which an inspection signal is supplied to the drain electrodes of the plurality of inspection transistors; and an abnormality determination unit that are electrically connected to at least one of the source electrodes of the plurality of inspection transistors and determines whether the display panel is abnormal. The abnormality determination unit determines whether the display panel is abnormal based on a voltage level of the inspection signal outputted from the at least one of the source electrodes of the plurality of inspection transistors.

In the display device according to the present disclosure, the plurality of inspection transistors may be divided into at least a first group of inspection transistors whose gate electrodes are electrically connected to an odd-numbered signal lines among the plurality of signal lines respectively, and a second group of inspection transistors whose gate electrodes are electrically connected to an even-numbered signal lines among the plurality of signal lines respectively. The inspection wiring may include: a first inspection wiring through which the inspection signal is supplied to drain electrodes of the inspection transistors included in the first group; and a second inspection wiring through which the inspection signal is supplied to drain electrodes of the inspection transistors included in the second group.

In the display device according to the present disclosure, the inspection wiring may include a first inspection wiring and a second inspection wiring. The plurality of signal lines may be divided into at least a first group including a part of the plurality of signal lines adjacent to each other and a second group including the plurality of signal lines adjacent to each other. A part of the plurality of inspection transistors electrically connected to another part of the plurality of signal lines included in the first group may be connected in cascade and are electrically connected to the first inspection wiring, and another part of the plurality of inspection transistors electrically connected to the plurality of signal lines included in the second group may be connected in cascade and are electrically connected to the second inspection wiring.

In the display device according to the present disclosure, the plurality of signal lines may be a plurality of data lines through which image data is supplied to each pixel. In each of the two inspection transistors adjacent to each other, respective gate electrodes may be electrically connected to different data lines, and the source electrode of one of the inspection transistors and the drain electrode of the other inspection transistor may be electrically connected to each other.

In the display device according to the present disclosure, the plurality of signal lines may be a plurality of gate lines through which a gate signal is supplied to a transistor of each pixel. In each of the two inspection transistors adjacent to each other, respective gate electrodes may be electrically connected to different gate lines, and the source electrode of one of the inspection transistors and the drain electrode of the other inspection transistor may be electrically connected to each other.

To solve the above problem, a display device according to the present disclosure comprises: a plurality of gate lines arranged in a display area of a display panel; a plurality of first inspection transistors each of which has a drain electrode, a source electrode and a gate electrode electrically connected to a corresponding one of the plurality of gate lines; a plurality of second inspection transistors each of which has a drain electrode, a source electrode and a gate electrode electrically connected to a corresponding one of the source electrodes of the plurality of first inspection transistors; a plurality of capacitors each of which has a first electrode electrically connected to a corresponding one of the source electrodes of the plurality of first inspection transistors and a corresponding one of the gate electrodes of the plurality of second inspection transistors; an inspection wiring through which an inspection signal is supplied to the drain electrodes of the plurality of first inspection transistors and the drain electrodes of the plurality of second inspection transistors; and an abnormality determination unit that that are electrically connected to at least one of the source electrodes of the plurality of second inspection transistors and determines whether the display panel is abnormal. The abnormality determination unit determines whether the display panel is abnormal based on a voltage level of the inspection signal outputted from the at least one of the source electrodes of the plurality of second inspection transistors.

The display device according to the present disclosure may further comprises a reset line electrically connected to second electrodes of the plurality of capacitors, and a reset signal may be supplied through the reset line in order to discharge the plurality of capacitors.

To solve the above problem, a method for inspecting a display device according to the present disclosure is provided, in which the display device includes: a plurality of signal lines arranged in a display region of a display panel; a plurality of inspection transistors electrically connected to the plurality of signal lines respectively; and an inspection wiring through which an inspection signal is supplied to the plurality of inspection transistors. The method comprising the steps of: supplying a voltage turning on the inspection transistor to gate electrodes of the plurality of inspection transistors through the plurality of signal lines of signal lines respectively in a vertical flyback period and supplying the inspection signal to drain electrodes of the plurality of inspection transistors through the inspection wiring in the vertical flyback period; and determining whether the display panel is abnormal based on a voltage level of the inspection signal outputted from at least one of source electrodes of the plurality of inspection transistors.

To solve the above problem, a method for inspecting a display device according to the present disclosure is provided, in which the display device includes: a plurality of gate lines arranged in a display area of the display panel; a plurality of first inspection transistors each of which has a drain electrode, a source electrode and a gate electrode electrically connected to a corresponding one of the plurality of gate lines; a plurality of second inspection transistors each of which has a drain electrode, a source electrode and a gate electrode electrically connected to a corresponding one of the source electrodes of the plurality of first inspection transistors; a plurality of capacitors each of which has a first electrode electrically connected to a corresponding one of the source electrodes of the plurality of first inspection transistors and a corresponding one of the gate electrodes of the plurality of second inspection transistors; and an inspection wiring through which an inspection signal is supplied to the drain electrodes of the plurality of first inspection transistors and the drain electrodes of the plurality of second inspection transistors. The method comprising the steps of: supplying sequentially a gate signal to the plurality of gate lines in a writing period and supplying the inspection signal having a voltage level bringing the plurality of second inspection transistors into an on state to the drain electrodes of the plurality of first inspection transistors through the inspection wiring in the writing period; supplying the inspection signal to the drain electrodes of the plurality of second inspection transistors through the inspection wiring in a vertical flyback period; and determining whether the display panel is abnormal based on a voltage level of the inspection signal outputted from at least one of the source electrode of the second inspection transistor.

The display device according to the present disclosure may further comprise the step of supplying a reset signal to second electrodes of the capacitors through a reset line after determining whether the display panel is abnormal in the vertical flyback period.

DETAILED DESCRIPTION

Hereinafter, an exemplary embodiment of the present disclosure will be described with reference to the drawings. In the exemplary embodiment, a liquid crystal display device is described as an example of display device. However the present disclosure is not limited to the liquid crystal display device. For example the present disclosure may be an organic electroluminescence display (OLED) device.

Figure 1:
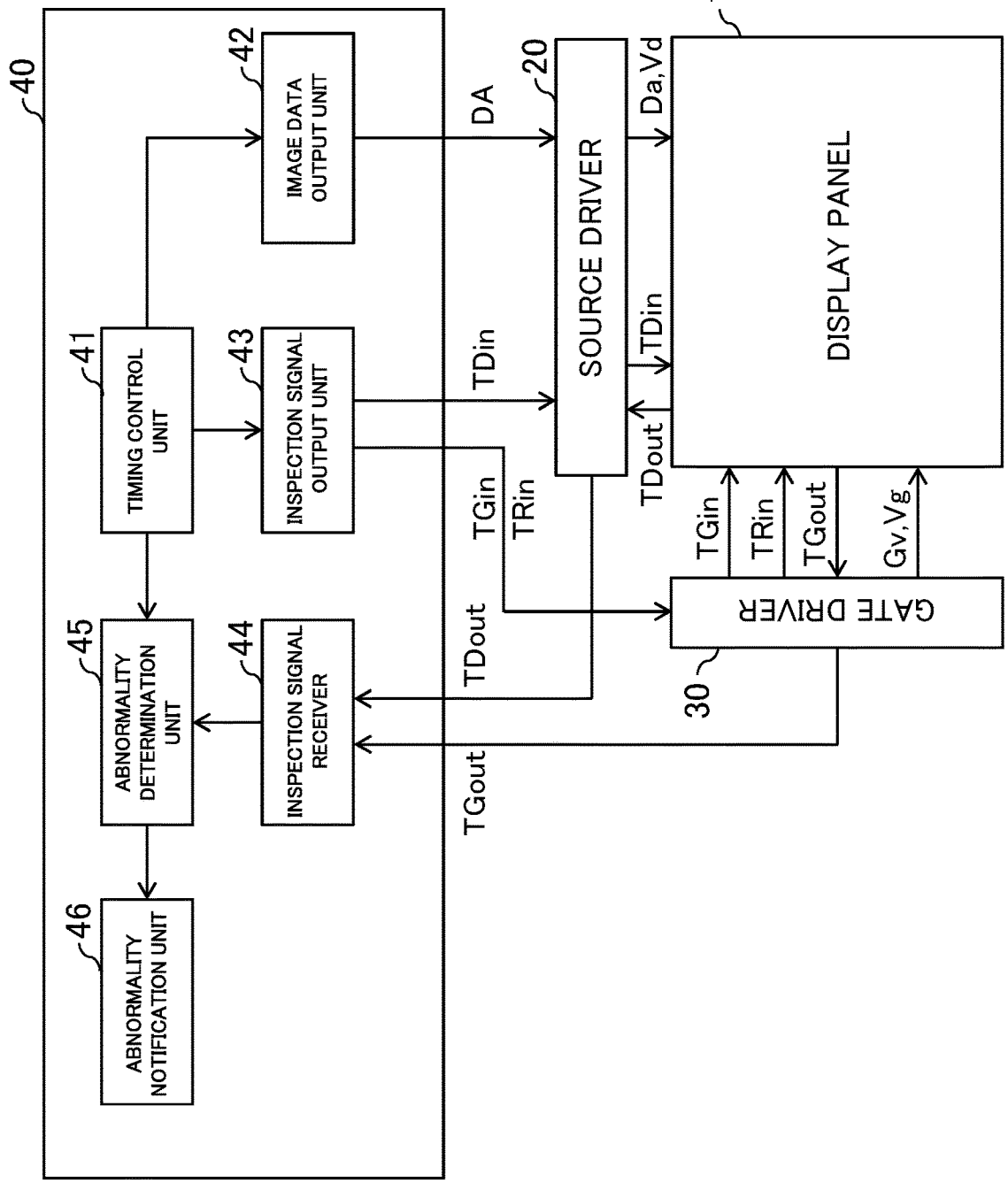
FIG. 1 is a block diagram illustrating a schematic configuration of a liquid crystal display device according to an exemplary embodiment.
Figure 2:
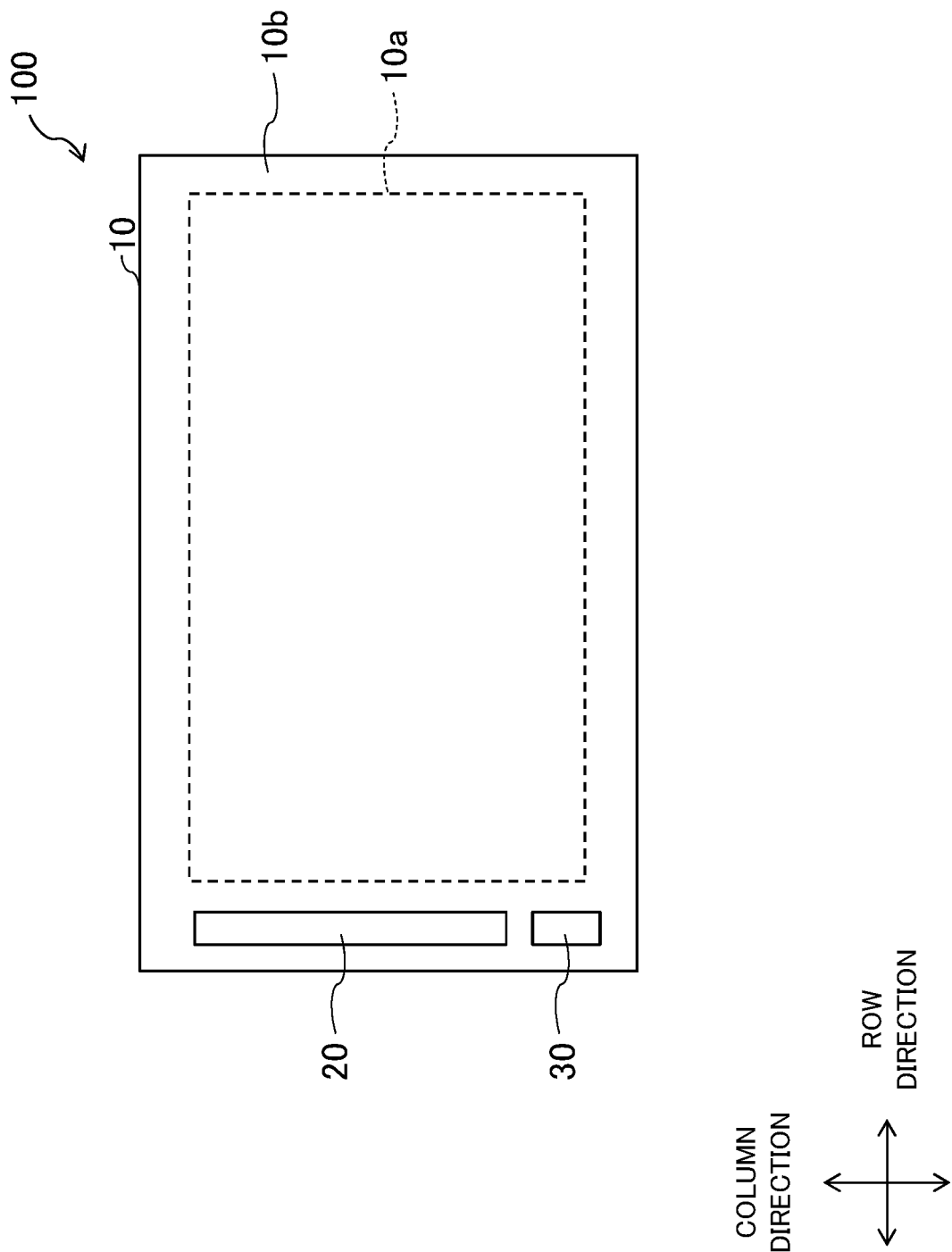
FIG. 2 is a plan view illustrating a schematic configuration of a display panel according to the exemplary embodiment.

FIG. 1 is a block diagram illustrating a schematic configuration of a liquid crystal display device according to the exemplary embodiment. Liquid crystal display device 100 includes display panel 10, source driver 20, gate driver 30, timing controller 40, and a backlight device (not illustrated). As illustrated in FIG. 2, source driver 20 and gate driver 30 may be mounted on display panel 10. In frame region 10b around display region 10a in display panel 10, an inspection wiring, an inspection transistor, and the like are provided in addition to source driver 20 and gate driver 30. A COF system liquid crystal display device is cited as an example of the liquid crystal display device of the exemplary embodiment. However, the liquid crystal display device of the exemplary embodiment is not limited to the COF system liquid crystal display device, but may be a TCP system liquid crystal display device, for example.

Figure 3:
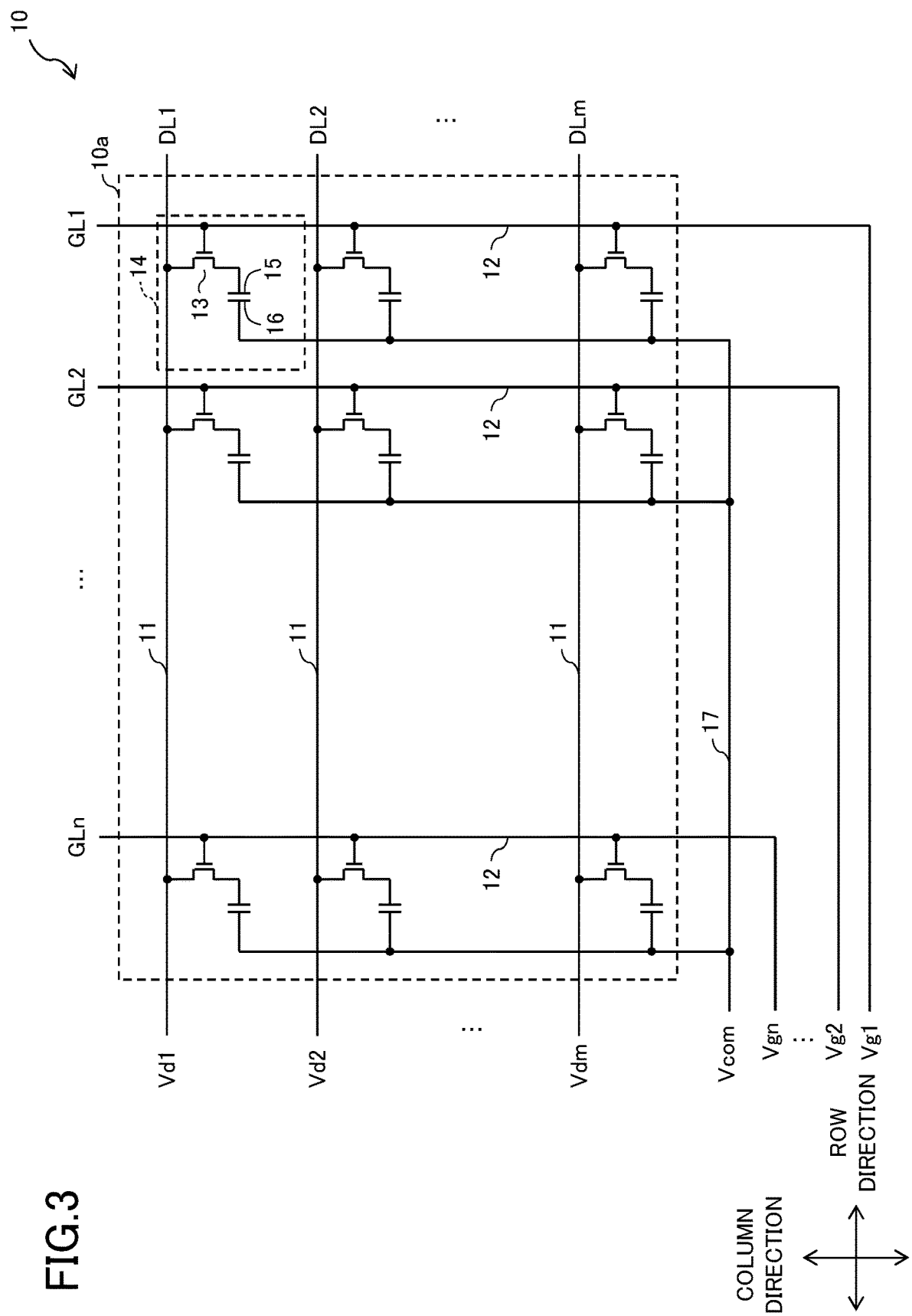
FIG. 3 is a plan view illustrating a schematic configuration of a display region of the display panel according to the exemplary embodiment.

FIG. 3 is a plan view illustrating a schematic configuration of display region 10a of display panel 10. A plurality (m) of data lines 11 (DL1, DL2, . . . , DLm) extending in a row direction and a plurality (n) of gate lines 12 (GL1, GL2, . . . , GLn) extending in a column direction are provided in display region 10a. Thin film transistor (TFT, pixel transistor) 13 is provided at an intersection of each data line 11 and each gate line 12. Each data line 11 is electrically connected to source driver 20. Each gate line 12 is electrically connected to gate driver 30.

In display region 10a, a plurality of pixels 14 are arranged into a matrix form (the row direction and the column direction) corresponding to the intersections of data lines 11 and gate lines 12. Although not illustrated, display panel 10 includes a thin film transistor substrate (TFT substrate), a color filter substrate (CF substrate), and a liquid crystal layer sandwiched between the TFT substrate and the CF substrate. A plurality of pixel electrodes 15 corresponding to respective pixels 14 and common electrode 16 common to respective pixels 14 are provided in the TFT substrate. Common electrode 16 may be provided in the CF substrate.

A data signal Da (gradation voltage Vd) is supplied from source driver 20 to each data line 11. Specifically, as illustrated in FIG. 3, data signals having gradation voltages Vd1, Vd2, . . . , Vdm corresponding to data lines DL1, DL2, . . . , DLm are supplied from source driver 20 to data lines DL1, DL2, . . . , DLm, respectively. Gate signal Gv (gate voltage Vg) is supplied from gate driver 30 to each gate line 12. Specifically, as illustrated in FIG. 3, gate signals having gate voltages Vg1, Vg2, . . . , Vgn corresponding to gate lines GL1, GL2, . . . , GLn are supplied from gate driver 30 to gate lines GL1, GL2, . . . , GLn, respectively. Common voltage Vcom is supplied to common electrode 16 through common wiring 17. When an on-voltage (gate-on voltage Vgh) of the gate signal is supplied to gate line 12, pixel transistor 13 connected to gate line 12 is turned on, and data voltage Vd is supplied to pixel electrode 15 through data line 11 connected to pixel transistor 13. An electric field is generated by a difference between data voltage Vd supplied to pixel electrode 15 and common voltage Vcom supplied to common electrode 16. Liquid crystal is driven by the electric field to control transmittance of light emitted from the backlight device, thereby displaying an image. In performing color display, desired data voltage Vd is supplied to data line 11 connected to pixel electrode 15 of pixel 14, corresponding to each of red, green, and blue, which are constructed with a stripe-shaped color filter.

Figure 4:
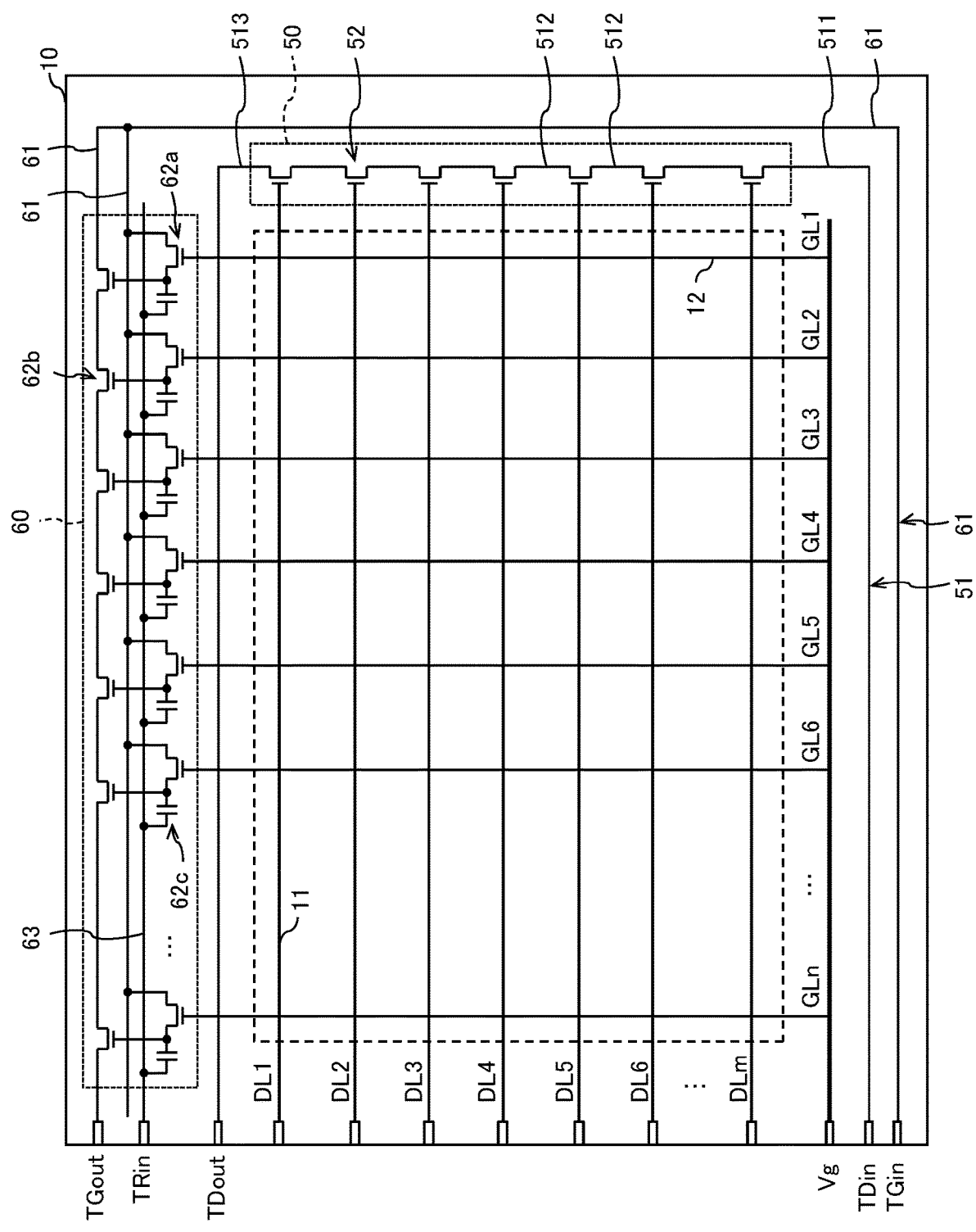
FIG. 4 is a plan view illustrating a schematic configuration of a frame region of the display panel according to the exemplary embodiment.

FIG. 4 is a plan view illustrating a schematic configuration of frame region 10b in display panel 10. Data line inspection circuit 50 that inspects the plurality of data lines 11, data line inspection wiring 51 connected to data line inspection circuit 50, gate line inspection circuit 60 that inspects the plurality of gate lines 12, and gate line inspection wiring 61 connected to gate line inspection circuit 60 are provided in frame region 10b.

Data line inspection circuit 50 includes a plurality of data line inspection transistors 52 corresponding to the plurality of data lines 11. The gate electrode (control electrode) of each data line inspection transistor 52 is connected to data line 11. The plurality of data line inspection transistors 52 are connected in series (cascade connection). That is, in the two data line inspection transistors 52 adjacent to each other, the output-side conduction electrode (source electrode) of one of data line inspection transistors 52 is connected to the input-side conduction electrode (drain electrode) of the other of data line inspection transistors 52. The input-side conduction electrode of data line inspection transistor 52 connected to data line DLm disposed in an endmost portion is electrically connected to the input terminal to which data line inspection signal TDin is input through data line inspection wiring 51. The output-side conduction electrode of data line inspection transistor 52 connected to data line DL1 disposed in the endmost portion is electrically connected to the output terminal to which data line inspection signal TDout is output through data line inspection wiring 51.

In particular, data line inspection wiring 51 in FIG. 4 includes input wiring portion 511 electrically connected to the input terminal to which data line inspection signal TDin is input, a plurality of connection wiring portions 512 that electrically connects the output-side conduction electrode (source electrode) of upstream-side data line inspection transistor 52 and the input-side conduction electrode (drain electrode) of downstream-side data line inspection transistor 52, and output wiring portion 513 electrically connected to the output terminal from which data line inspection signal TDout is output.

Gate line inspection circuit 60 includes a plurality of first gate line inspection transistors 62a corresponding to the plurality of gate lines 12, a plurality of second gate line inspection transistors 62b corresponding to the plurality of gate lines 12, and a plurality of holding circuits 62c corresponding to the plurality of gate lines 12. Holding circuit 62c is not particularly limited. For example, holding circuit 62c is constructed with a capacitor. The gate electrode (control electrode) of each first gate line inspection transistor 62a is connected to gate line 12. The input-side conduction electrode (drain) of each first gate line inspection transistor 62a is electrically connected to the input terminal of gate line inspection signal TGin through gate line inspection wiring 61. The output-side conduction electrode (source) of each first gate line inspection transistor 62a is connected to the gate electrode (control electrode) of second gate line inspection transistor 62b and one of electrodes of capacitor 62c. The other electrode of capacitor 62c is electrically connected to the input terminal of reset signal TRin through reset line 63. The plurality of second gate line inspection transistors 62b are connected in series (cascade connection). That is, in the two second gate line inspection transistors 62b adjacent to each other, the output-side conduction electrode (source electrode) of one of second gate line inspection transistors 62b is connected to the input-side conduction electrode (drain electrode) of the other of second gate line inspection transistors 62b. The input-side conduction electrode of second gate line inspection transistor 62b connected to gate line GL1 disposed in the endmost portion is electrically connected to the input terminal of gate line inspection signal TGin through gate line inspection wiring 61. The output-side conduction electrode of second gate line inspection transistor 62b connected to gate line GLn disposed in the endmost portion is electrically connected to the output terminal of gate line inspection signal TGout through gate line inspection wiring 61.

Referring to FIG. 1, timing controller 40 includes timing control unit 41, image data output unit 42, inspection signal output unit 43, inspection signal receiver 44, abnormality determination unit 45, and abnormality notification unit 46. In the example of FIG. 1, inspection signal output unit 43, inspection signal receiver 44, and abnormality determination unit 45 are included in timing controller 40. However, but the present disclosure is not limited to the example of FIG. 1. Inspection signal output unit 43, inspection signal receiver 44, and abnormality determination unit 45 may be included in source driver 20 or gate driver 30, or included in a source and gate integrated driver (not illustrated).

Timing control unit 41 generates a control signal controlling operation timing in source driver 20 and gate driver 30. Examples of the control signal include a data start pulse, a data clock, a gate start pulse, a gate clock, and various timing signals. Timing control unit 41 controls output timing of image data DA output from image data output unit 42 and output timing of inspection signals TDin, TGin, and TRin output from inspection signal output unit 43.

Image data output unit 42 outputs image data DA generated by timing controller 40 to source driver 20 based on the control signal of timing control unit 41. Timing controller 40 performs known image processing to generate image data DA. Source driver 20 supplies data signal Da (gradation voltage Vd) corresponding to image data DA to data line 11.

Inspection signal output unit 43 outputs data line inspection signal TDin to source driver 20 based on the control signal of timing control unit 41, and outputs gate line inspection signal TGin and reset signal TRin to gate driver 30.

Inspection signal receiver 44 receives data line inspection signal TDout from source driver 20, and receives the gate line inspection signal TGout from gate driver 30.

Abnormality determination unit 45 determines whether an abnormality is generated in liquid crystal display device 100 based on data line inspection signal TDout and gate line inspection signal TGout, which are received by inspection signal receiver 44. Abnormality determination unit 45 determines whether the abnormality is generated in liquid crystal display device 100 based on the control signal (timing signal) of timing control unit 41.

When the abnormality is generated in liquid crystal display device 100, abnormality notification unit 46 notifies the outside of the abnormality. For example, the abnormality notification unit 46 may display an error message on display panel 10, or transmit an error sound to the outside, or turn on an error lamp provided outside display area 10a.

When receiving data line inspection signal TDin from inspection signal output unit 43, source driver 20 outputs data line inspection signal TDin to data line inspection wiring 51 (see FIG. 4). When receiving data line inspection signal TDout from data line inspection wiring 51, source driver 20 outputs data line inspection signal TDout to inspection signal receiver 44.

Gate driver 30 outputs gate line inspection signal TGin to gate line inspection wiring 61 (see FIG. 4) when receiving gate line inspection signal TGin from inspection signal output unit 43, and gate driver 30 outputs reset signal TRin to reset line 63 (see FIG. 4) when receiving reset signal TRin from inspection signal output unit 43. When receiving gate line inspection signal TGout from gate line inspection wiring 61, gate driver 30 outputs gate line inspection signal TGout to inspection signal receiver 44.

Figure 5:
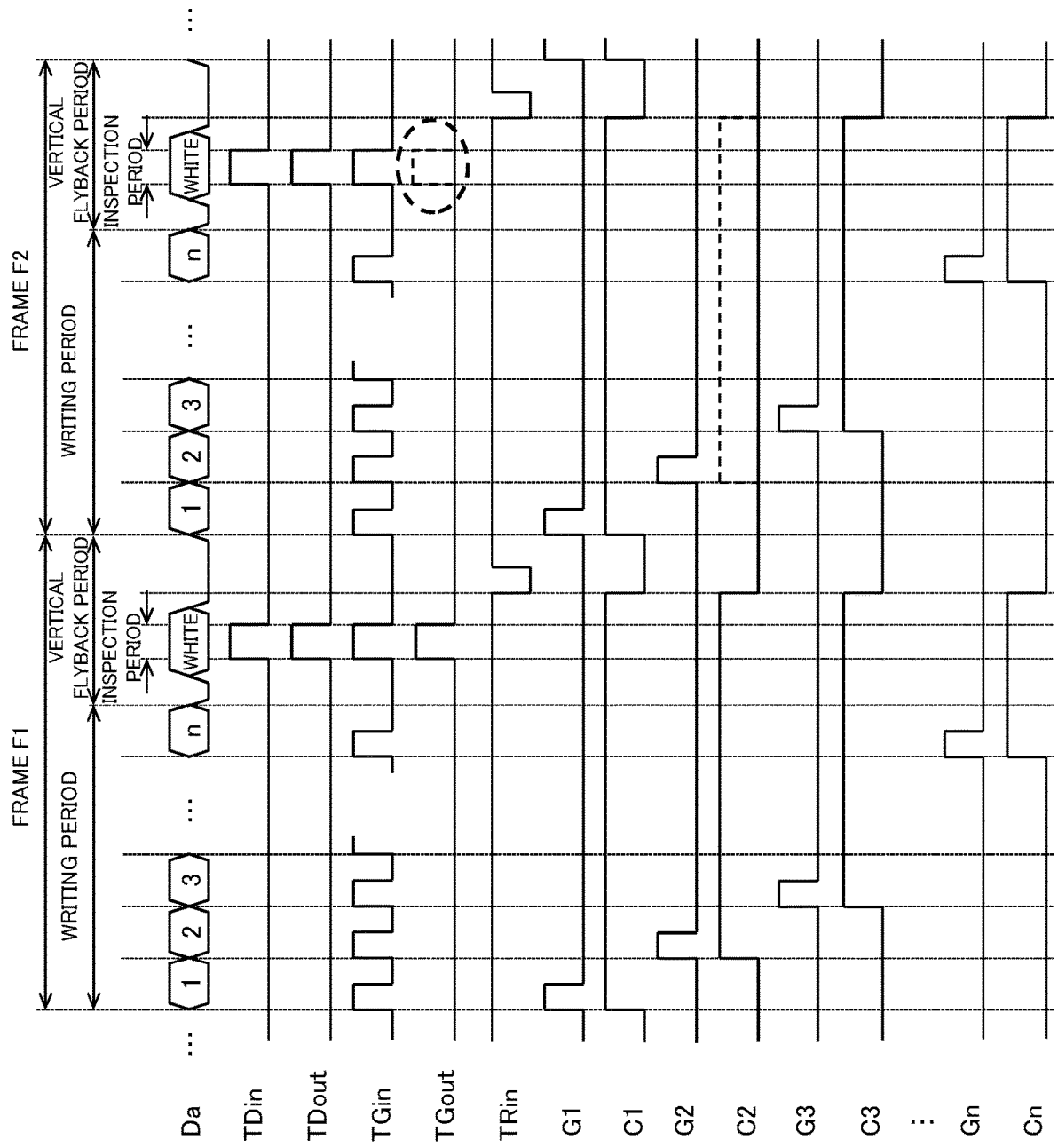
FIG. 5 is timing charts illustrating signals input to and output from the liquid crystal display device according to the exemplary embodiment.
Figure 6:
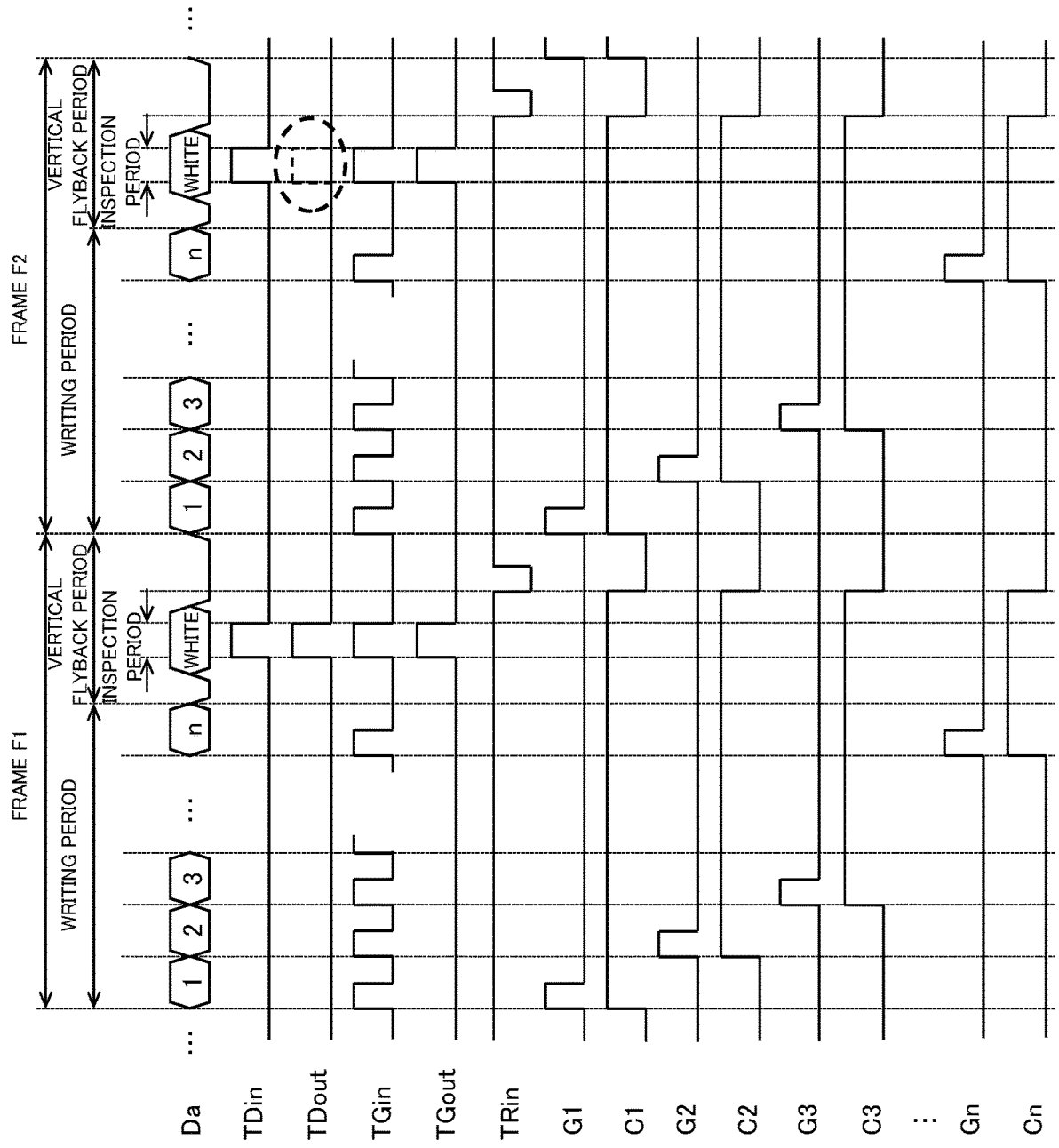
FIG. 6 is timing charts illustrating signals input to and output from the liquid crystal display device according to the exemplary embodiment.

FIGS. 5 and 6 are timing charts illustrating signals input to and output from liquid crystal display device 100. FIG. 5 illustrates a timing chart in the case that an abnormality is generated in data line 11 in frame F2, and FIG. 6 illustrates a timing chart in the case that an abnormality is generated in gate line 12 in frame F2. A method for inspecting liquid crystal display device 100 will specifically be described with reference to FIGS. 5 and 6. Consecutive frames F1 and F2 are illustrated in FIGS. 5 and 6, Da denotes data signal supplied to data line 11, G1 to G3, Gn denotes gate signals supplied to gate lines 12 of the first to third lines, the nth line, and C1 to C3, Cn corresponding to the first to third lines, the nth line denotes capacitances of capacitors 62c. TDin denotes the data line inspection signal input to the input terminal connected to data line inspection wiring 51, and TDout denotes the data line inspection signal output from the output terminal connected to data line inspection wiring 51. TGin denotes Gate line inspection signal input to the input terminal connected to gate line inspection wiring 61, and TGout denotes gate line inspection signal outputted from the output terminal connected to gate line inspection wiring 61. TRin denotes reset signal input to the input terminal connected to reset line 63.

Frame F1 in FIGS. 5 and 6 will be described. An example of the case that liquid crystal display device 100 operates normally without generating the defect is illustrated in frame F1. Referring to FIGS. 5 and 6, in frame F1, the gradation voltage according to data signal Da is written in each pixel based on on and off of gate signal G1 in each horizontal scanning period. When gate signal G1 is at a high level (gate-on voltage), first gate line inspection transistor 62a is turned on, high-level gate line inspection signal TGin output from inspection signal output unit 43 (see FIG. 1) is input to capacitor 62c through gate line inspection wiring 61, and capacitor 62c corresponding to the first line is charged. When capacitor 62c corresponding to the first line is charged, second gate line inspection transistor 62b corresponding to the first line is turned on. The capacitance of capacitor 62c corresponding to the first line is held even if gate signal G1 becomes a low level (gate-off voltage) to turn off first gate line inspection transistor 62a. It is assumed that the capacitance held in capacitor 62c has a capacitance at which second gate line inspection transistor 62b can be maintained in the on state. Then, second gate line inspection transistors 62b corresponding to the second to nth lines are turned on according to the on and off of gate signals G2 to Gn. Consequently, all second gate line inspection transistors 62b corresponding to all the lines are turned on. When the writing period of frame F1 is ended, inspection signal output unit 43 inputs high-level gate line inspection signal TGin to gate line inspection wiring 61 based on the control signal of timing control unit 41 between vertical flyback periods. High-level gate line inspection signal TGin is transmitted through gate line inspection wiring 61 and all second gate line inspection transistors 62b in the on state, and gate line inspection signal TGout becomes the high level.

When receiving gate line inspection signal TGout transferred from gate driver 30, inspection signal receiver 44 outputs gate line inspection signal TGout to abnormality determination unit 45. Abnormality determination unit 45 determines whether the abnormality is generated based on a potential (voltage level) at gate line inspection signal TGout in the inspection period which period is decided based on the control signal of timing control unit 41. For example, the inspection period is a high-level period of gate line inspection signal TGin output from inspection signal output unit 43 in a vertical flyback period. For example, in the case that all gate lines 12 are normal without the defect such as the disconnection, because first gate line inspection transistor 62a and second gate line inspection transistor 62b are normally turned on, gate line inspection signal TGout becomes the high level when high-level gate line inspection signal TGin is input. Consequently, abnormality determination unit 45 determines that liquid crystal display device 100 operates normally when gate line inspection signal TGout is at the high level. On the other hand, in the case that the defect such as the disconnection is generated in at least one of gate lines 12, second gate line inspection transistor 62b is not turned on because corresponding first gate line inspection transistor 62a is not turned on, but gate line inspection signal TGout becomes the low level even if high-level gate line inspection signal TGin is input. Consequently, abnormality determination unit 45 determines that the abnormality is generated when gate line inspection signal TGout is at the low level.

In frame F1 of FIG. 5, abnormality determination unit 45 determines that gate line 12 is normal because gate line inspection signal TGout becomes the high level. Abnormality informing unit 46 does not need to notify the outside or may display a message indicating normal (for example, turning on a green lamp).

In a predetermined period of the vertical flyback period, image data output unit 42 outputs the voltage (image data DA) turning on data line inspection transistor 52. For example, image data output unit 42 outputs image data DA corresponding to 255 gradations (white). Data signal Da (gradation voltage) corresponding to the 255 gradations is supplied to each data line 11. Consequently, each data line inspection transistor 52 is turned on because data signal Da is supplied to the gate electrode of each data line inspection transistor 52. Based on the control signal of timing control unit 41, inspection signal output unit 43 outputs high-level data line inspection signal TDin in a period during which image data output unit 42 outputs image data DA corresponding to the 255 gradations. High-level data line inspection signal TDin is transmitted through all data line inspection transistors 52 in the on state, and data line inspection signal TDout becomes the high level.

When receiving data line inspection signal TDout transferred from source driver 20, inspection signal receiver 44 outputs data line inspection signal TDout to abnormality determination unit 45. Abnormality determination unit 45 determines whether the abnormality is generated based on the potential (voltage level) at data line inspection signal TDout in the inspection period decided based on the control signal of timing control unit 41. For example, the inspection period is a high-level period of data line inspection signal TDin output from inspection signal output unit 43 in the vertical flyback period. For example, in the case that all data lines 11 are normal without the defect such as the disconnection, because data line inspection transistor 52 is normally turned on, data line inspection signal TDout becomes the high level when high-level data line inspection signal TDin is input. Consequently, abnormality determination unit 45 determines that liquid crystal display device 100 operates normally when data line inspection signal TDout is at the high level. On the other hand, in the case that the defect such as the disconnection is generated in at least one of data lines 11, because corresponding data line inspection transistor 52 is not turned on, data line inspection signal TDout becomes the low level even if high-level data line inspection signal TDin is input. Consequently, abnormality determination unit 45 determines that the abnormality is generated when data line inspection signal TDout is at the low level.

In frame F1 of FIG. 5, abnormality determination unit 45 determines that data line 11 is normal because data line inspection signal TDout becomes the high level.

Abnormality determination unit 45 may determine whether gate line 12 and data line 11 are normal after receiving both gate line inspection signal TGout and data line inspection signal TDout. When detecting the abnormality, abnormality determination unit 45 may notify the outside such that which one of gate line 12 and data line 11 is abnormal can be specified.

Frame F2 in FIG. 5 will be described below. An example of the case that the defect is generated in gate line 12 is illustrated in frame F2. The case that the disconnection is generated in gate line GL2 of the second line is cited as an example.

When the inspection period is ended in the vertical flyback period in frame F1 immediately before frame F2, inspection signal output unit 43 outputs reset signal TRin to gate driver 30. Reset signal TRin is supplied to reset line 63 through gate driver 30. Consequently, charge charged in capacitor 62c is discharged to rest the capacitance. After the reset processing is completed, the processing of frame F2 is started.

In frame F2, when gate signal G2 (gate-on voltage) is supplied to gate line GL2 of the second line, because gate line GL2 is disconnected, gate signal G2 is not supplied to corresponding first gate line inspection transistor 62a, and first gate line inspection transistor 62a is not turned on. Consequently, high-level gate line inspection signal TGin is not supplied to capacitor 62c through corresponding second gate line inspection transistor 62b (dotted line waveform in FIG. 5), and capacitor 62c is not charged. In addition, second gate line inspection transistor 62b is not turned on. As a result, in the inspection period of the vertical flyback period, high-level gate line inspection signal TGin output from inspection signal output unit 43 is not transmitted through gate line inspection wiring 61, but gate line inspection signal TGout becomes the low level (encircled portion in FIG. 5).

When receiving low-level gate line inspection signal TGout transferred from gate driver 30, inspection signal receiver 44 outputs gate line inspection signal TGout to abnormality determination unit 45. When receiving low-level gate line inspection signal TGout, abnormality determination unit 45 determines that gate line 12 is abnormal. Abnormality informing unit 46 performs an indication that gate line 12 is abnormal (for example, turning on a red lamp).

Frame F2 in FIG. 6 will be described below. An example that the defect is generated in data line 11 is illustrated in frame F2. The case that the disconnection is generated in data line DL3 of the third line is cited as an example.

When data signal Da corresponding to the 255 gradations is supplied to all data lines 11 in the inspection period of the vertical flyback period, because data line DL3 is disconnected, data signal Da is not supplied to corresponding data line inspection transistor 52, and data line inspection transistor 52 is not turned on. Consequently, in the inspection period, high-level data line inspection signal TDin output from inspection signal output unit 43 is not transmitted through data line inspection wiring 51, but data line inspection signal TDout becomes the low level (encircled portion in FIG. 6).

When receiving low-level data line inspection signal TDout transferred from source driver 20, inspection signal receiver 44 outputs data line inspection signal TDout to abnormality determination unit 45. When receiving low-level data line inspection signal TDout, abnormality determination unit 45 determines that data line 11 is abnormal. Abnormality informing unit 46 performs an indication that data line 11 is abnormal (for example, turning on the red lamp).

As described above, the defect of display panel 10 can be detected during the normal use (during display operation). The outside is notified of the abnormality, a user can immediately recognize the generation of the abnormality in display panel 10. Liquid crystal display device 100 of the exemplary embodiment can be used as, for example, an onboard display device (instrument panel or the like). In this case, a driver can immediately recognize that the abnormality (for example, the disconnection) is generated in the instrument panel. Therefore, the driver can perform rapid response and avoid danger in advance during driving.

The above inspection processing may be performed for each frame or each plurality of frames. The processing of inspecting data line 11 and the processing of inspecting gate line 12 may be performed in the same frame or different frames.

Figure 7:
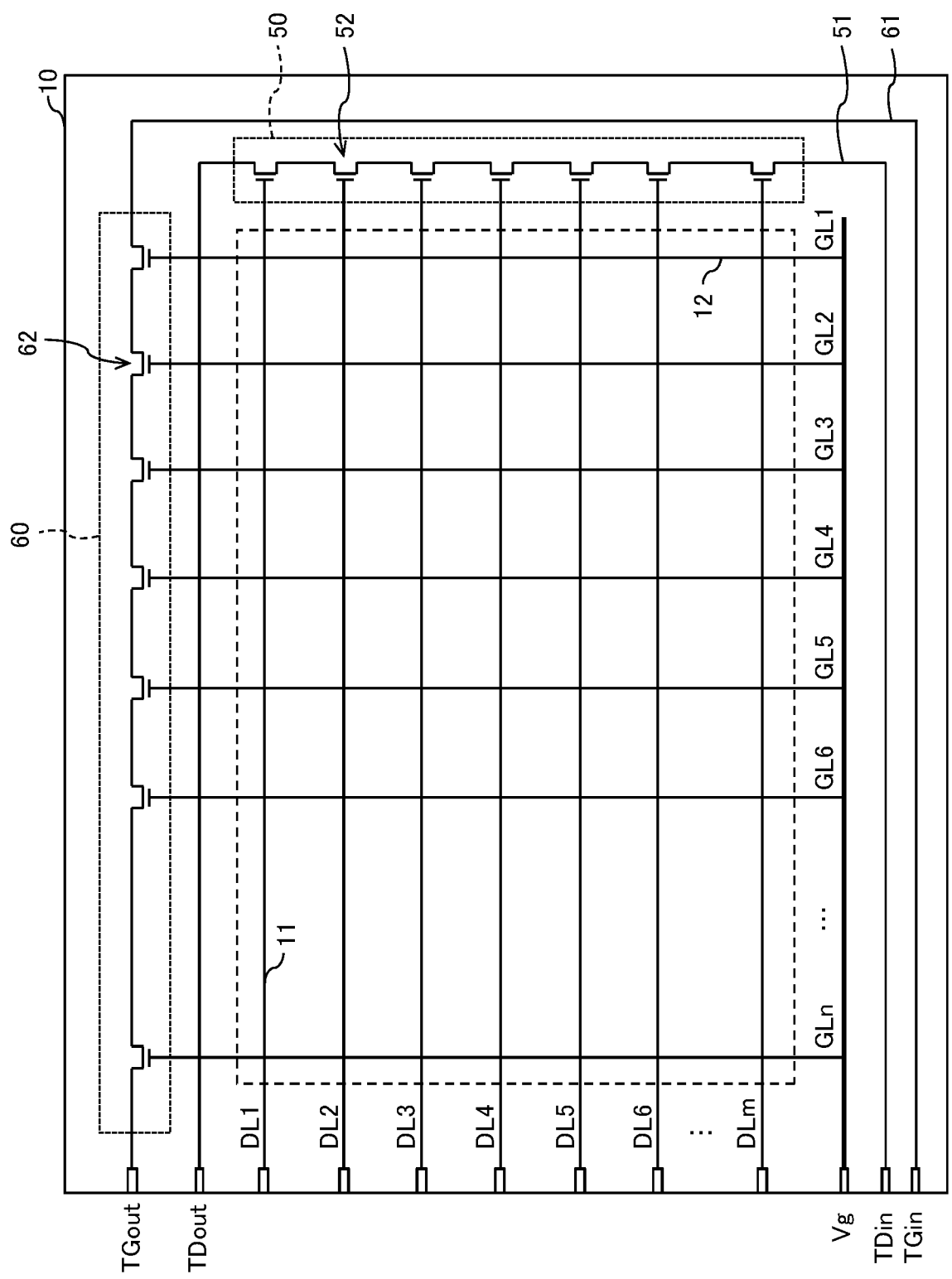
FIG. 7 is a plan view illustrating another configuration of the display panel according to the exemplary embodiment.

Liquid crystal display device 100 of the exemplary embodiment is not limited to the above configuration. FIG. 7 is a plan view illustrating another configuration of display panel 10. Data line inspection circuit 50 has the same configuration as that in FIG. 4. The configuration of gate line inspection circuit 60 in FIG. 7 will be described below.

Gate line inspection circuit 60 in FIG. 7 includes a plurality of gate line inspection transistors 62 corresponding to the plurality of gate lines 12. The gate electrode (control electrode) of each gate line inspection transistor 62 is connected to gate line 11. The plurality of gate line inspection transistors 62 are connected in series (cascade connection). That is, in the two gate line inspection transistors 62 adjacent to each other, the output-side conduction electrode (source electrode) of one of gate line inspection transistors 62 is connected to the input-side conduction electrode (drain electrode) of the other of gate line inspection transistors 62. The input-side conduction electrode of gate line inspection transistor 62 connected to gate line GL1 disposed in the endmost portion is electrically connected to the input terminal to which gate line inspection signal TGin is input through gate line inspection wiring 61. The output-side conduction electrode of gate line inspection transistor 62 connected to gate line GLn disposed in the endmost portion is electrically connected to the output terminal to which gate line inspection signal TGout is output through gate line inspection wiring 61.

Inspection signal output unit 43 outputs data line inspection signal TDin to source driver 20 based on the control signal of timing control unit 41, and outputs gate line inspection signal TGin to gate driver 30. In this configuration, capacitor 62c and reset signal TRin are omitted.

Figure 8:
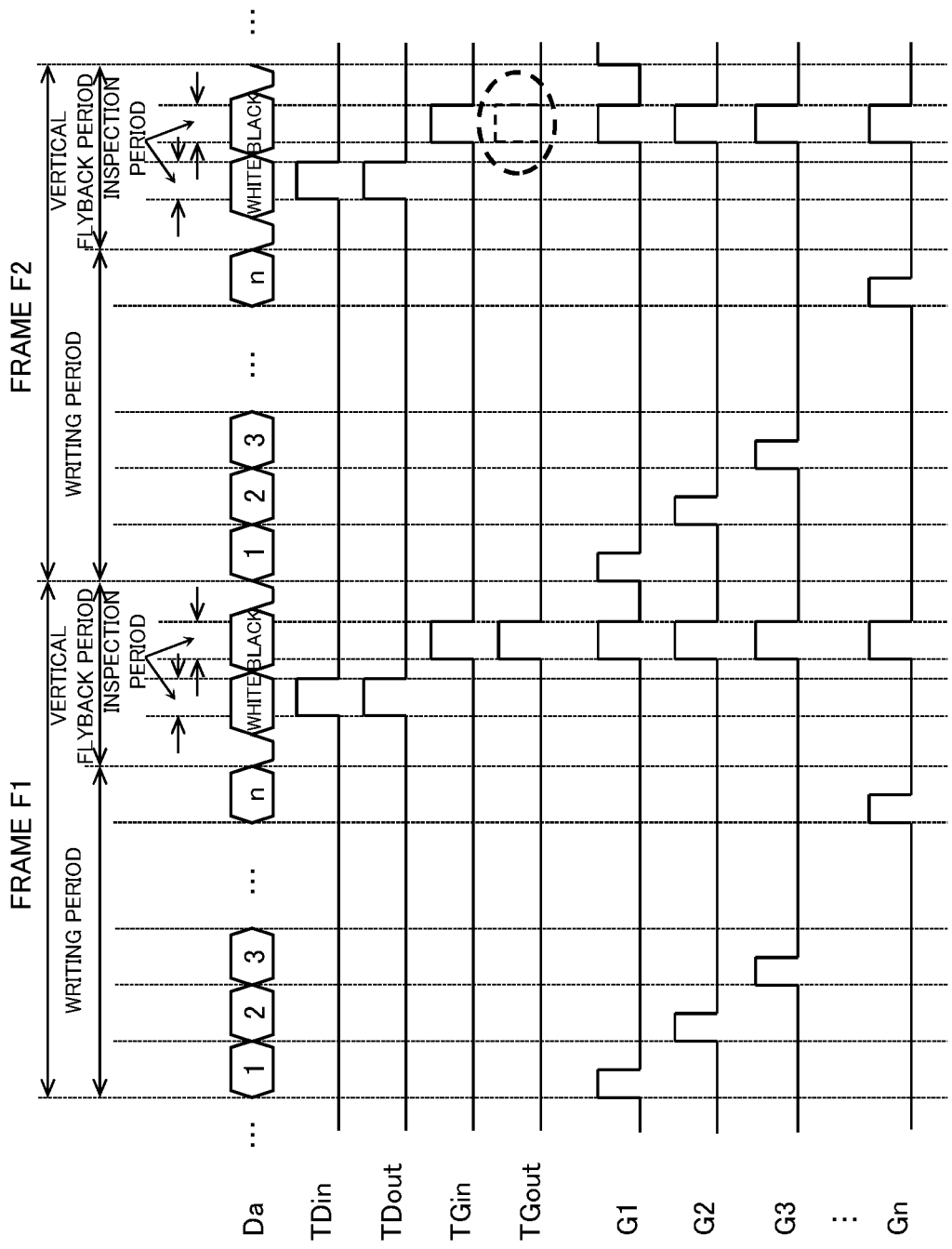
FIG. 8 is timing charts illustrating signals input to and output from the liquid crystal display device shown in FIG. 7.

FIG. 8 is a timing chart illustrating signals input to and output from liquid crystal display device 100 in FIG. 7. In FIG. 8, frame F1 illustrates an example of the case that liquid crystal display device 100 operates normally without generating the defect, and frame F2 illustrates an example of the case that the abnormality is generated in gate line 12 (gate line GL2 of the second line). In this configuration, the inspection period of data line 11 is different from the inspection period of gate line 12. Because the method of inspecting data line 11 is identical to the method in FIGS. 5 and 6, the method for inspecting gate line 12 will be described below.

In the vertical flyback period of frame F1, image data output unit 42 outputs image data DA corresponding to black. Data signal Da (gradation voltage) corresponding to the black (zero gradation) is supplied to each data line 11. In a period during which image data output unit 42 outputs image data DA corresponding to the black, gate driver 30 supplies gate signal Gv (gate-on voltage Vgh) to all gate lines 12 based on the control signal of timing control unit 41. Consequently, each gate line inspection transistor 62 is turned on because gate signal Gv is supplied to the gate electrode of each gate line inspection transistor 62. Based on the control signal of timing control unit 41, inspection signal output unit 43 outputs high-level gate line inspection signal TGin in a period during which image data output unit 42 outputs image data DA corresponding to the black. High-level gate line inspection signal TGin is transmitted through all gate line inspection transistors 62 in the on state, and gate line inspection signal TGout becomes the high level. In frame F1, abnormality determination unit 45 determines that gate line 12 is normal because gate line inspection signal TGout becomes the high level.

In frame F2, when gate signal Gv (gate-on voltage Vgh) is supplied to all gate lines 12 in the inspection period of the vertical flyback period, because gate line GL2 is disconnected, gate signal Gv is not supplied to corresponding gate line inspection transistor 62, and gate line inspection transistor 62 is not turned on. For this reason, in the inspection period, high-level gate line inspection signal TGin output from inspection signal output unit 43 is not transmitted through gate line inspection wiring 61, but gate line inspection signal TGout becomes the low level (encircled portion in FIG. 8). In frame F2, abnormality determination unit 45 determines that gate line 12 is abnormal because gate line inspection signal TGout becomes the high level.

In the above configuration, the defect of display panel 10 can be detected. In the above configuration, each pixel transistor 13 (see FIG. 3) is turned on because gate signal Gv is supplied to all gate lines 12 in the inspection period. However, data voltage Da (gradation voltage) corresponding to the black (zero gradation) is written in each pixel to perform the black display, so that the display quality is not degraded.

Figure 9:
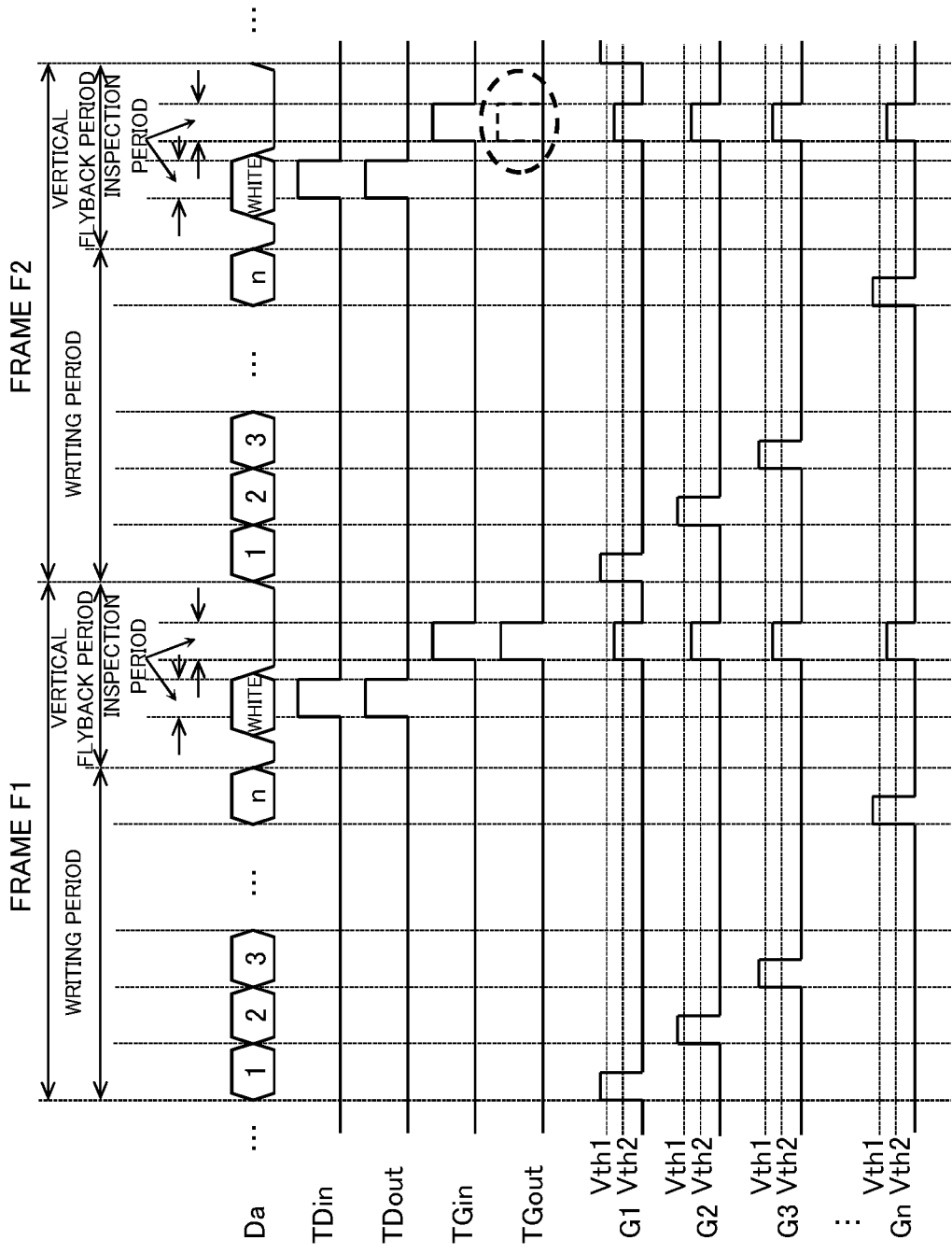
FIG. 9 is timing charts illustrating signals input to and output from the liquid crystal display device shown in FIG. 7.

The inspection method in FIG. 9 may be performed in the configuration of FIG. 7. In the inspection method of FIG. 9, image data output unit 42 does not output the image data in the inspection period of gate line 12, but inspection signal output unit 43 supplies gate signal Gv (Vth2<gate-on voltage Vgh'<Vth1) to all gate lines 12, the gate signal being lower than threshold voltage Vth1 bringing pixel transistor 13 into the on state and higher than threshold voltage Vth2 bringing gate line inspection transistor 62 into the on state. Consequently, the determination whether gate line 12 is normal can be made based on the voltage level of gate line inspection signal TGout by the turn-on and turn-off of gate line inspection transistor 62. Threshold voltages Vth1, Vth2 can be adjusted by changing a structure (such as a material and a size) of the transistor.

Figure 10:
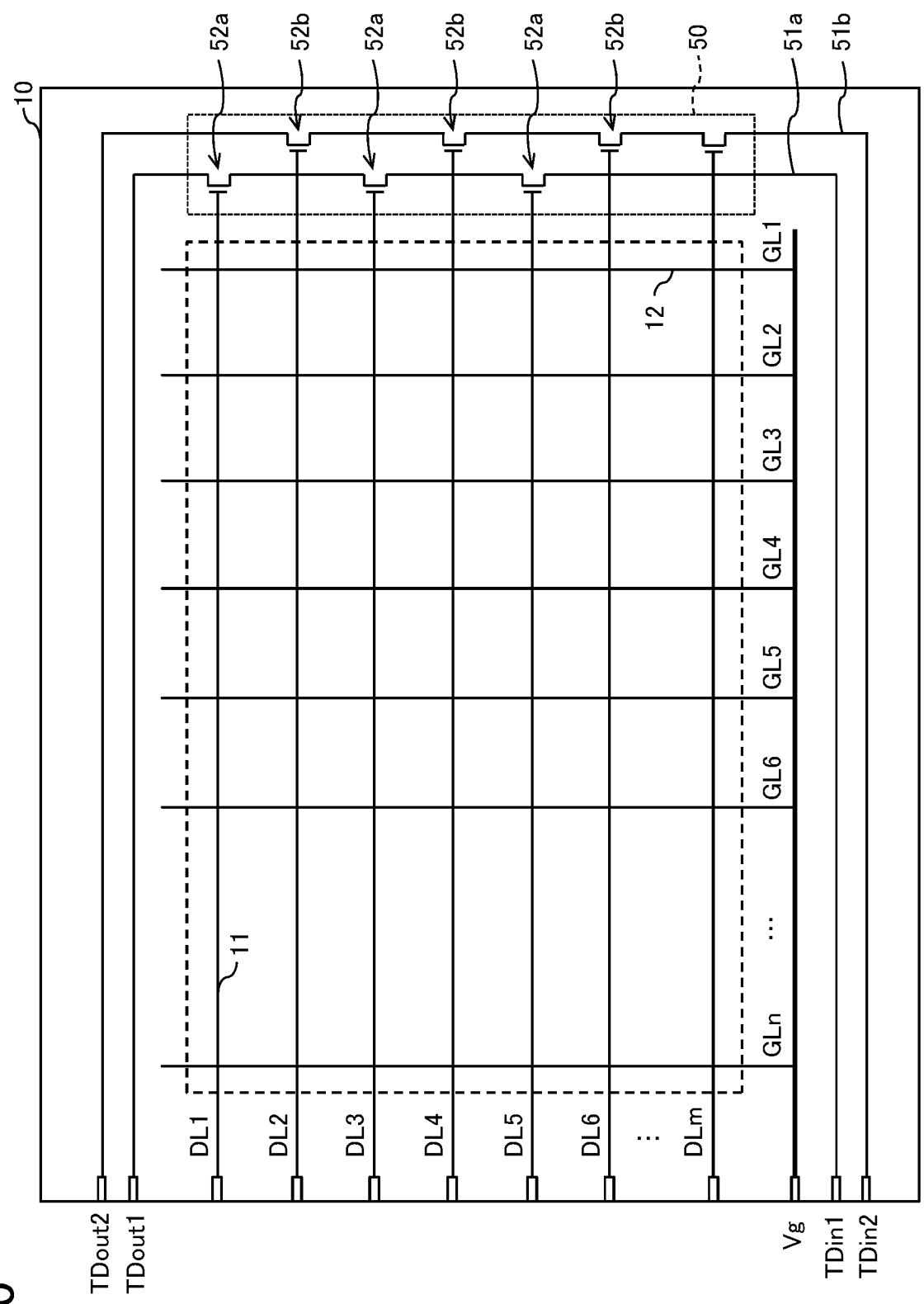
FIG. 10 is a plan view illustrating another configuration of the display panel according to the exemplary embodiment.

FIG. 10 is a plan view illustrating another configuration of display panel 10. At this point, data line inspection circuit 50 is illustrated, and gate line inspection circuit 60 is omitted.

In data line inspection circuit 50 of FIG. 10, data line inspection transistors 52a connected to odd-numbered data lines 11 (data lines DL1, DL3, DL5) are connected in series (cascade connection), and data line inspection transistors 52b connected to even-numbered data lines 11 (data lines DL2, DL4, DL6) are connected in series (cascade connection). Data line inspection wiring 51a is connected to data line inspection transistor 52a, and data line inspection signal TDin1 is supplied to data line inspection transistor 52a. Data line inspection wiring 51b is connected to data line inspection transistor 52b, and data line inspection signal TDin2 is supplied to data line inspection transistor 52b.

In the above configuration, abnormality determination unit 45 determines whether odd-numbered data lines 11 are normal based on the voltage level of data line inspection signal TDout1, and determines whether even-numbered data lines 11 are normal based on the voltage level of data line inspection signal TDout2. According to the above configuration, a resistance per data line inspection wiring can be reduced. Liquid crystal display device 100 having the above configuration may determine whether odd-numbered and even-numbered data lines 11 are normal in each frame, and may replace the processing of determining odd-numbered data line 11 and the processing of determining even-numbered data line 11 with each other in each frame. The above configuration can similarly be applied to gate line inspection circuit 60 in FIG. 4 and gate line inspection circuit 60 in FIG. 7.

Figure 11:
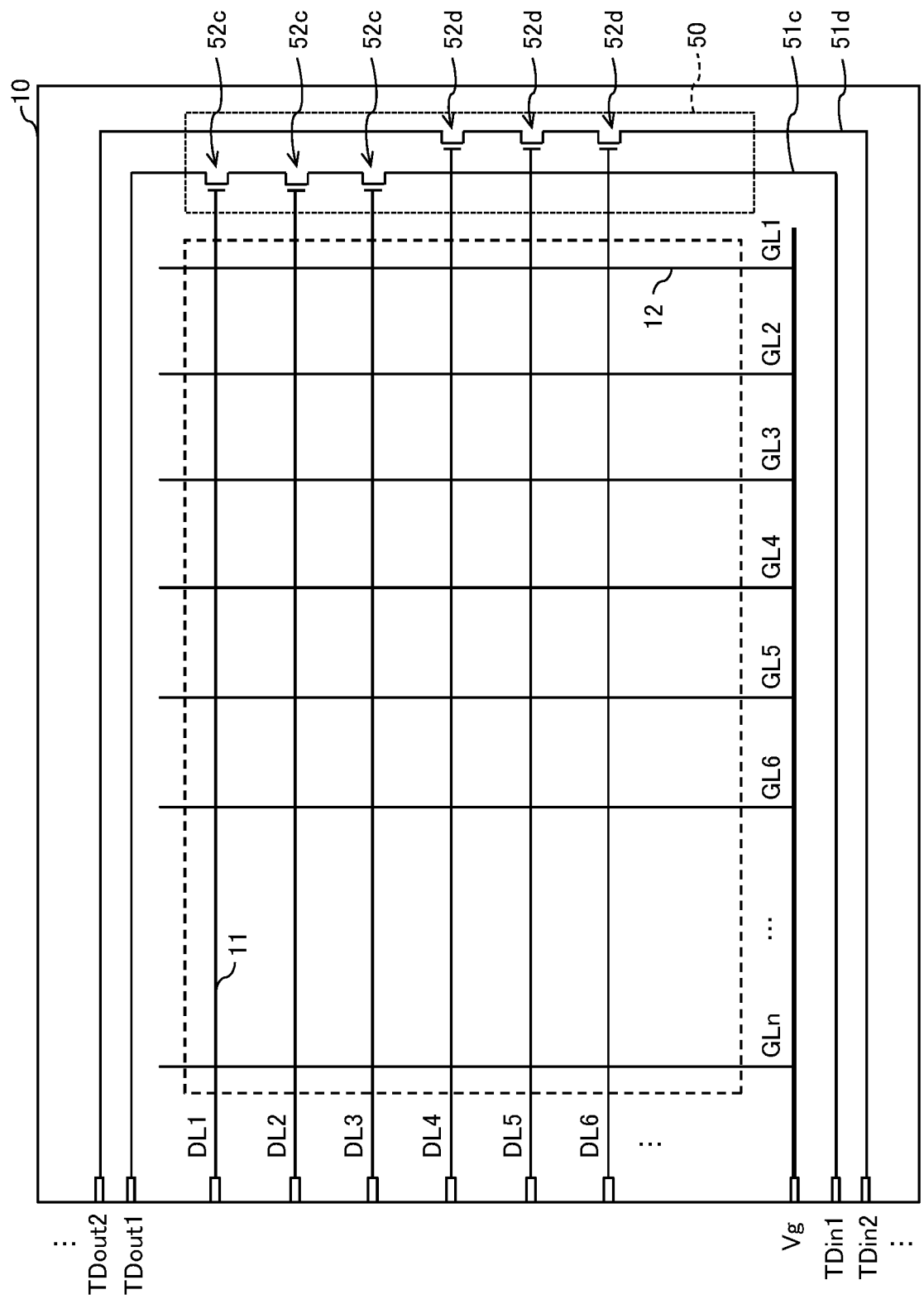
FIG. 11 is a plan view illustrating another configuration of the display panel according to the exemplary embodiment.

FIG. 11 is a plan view illustrating still another configuration of display panel 10. At this point, data line inspection circuit 50 is illustrated, and gate line inspection circuit 60 is omitted.

In data line inspection circuit 50 of FIG. 11, data line inspection transistors 52c connected to the plurality of data lines 11 (data lines DL1, DL2, DL3) included in a first group are connected in series (cascade connection), and data line inspection transistors 52d connected to the plurality of data lines 11 (data lines DL4, DL5, DL6) included in a second group are connected in series (cascade connection). Data line inspection wiring 51c is connected to data line inspection transistor 52c, and data line inspection signal TDin1 is supplied to data line inspection transistor 52c. Data line inspection wiring 51d is connected to data line inspection transistor 52d, and data line inspection signal TDin2 is supplied to data line inspection transistor 52d.

In the above configuration, abnormality determination unit 45 determines whether data lines 11 of the first group are normal based on the voltage level of data line inspection signal TDout1, and determines whether data lines 11 of the second group are normal based on the voltage level of data line inspection signal TDout2. According to the above configuration, a resistance per data line inspection wiring can be reduced. Because the abnormality is determined in each group, an abnormal point (abnormality group) can easily be specified when the abnormality (for example, the disconnection) is generated. The number of the groups depends on the size of display panel 10 (the number of data lines 11, an area of frame region 10b), the wiring resistance of the data line inspection wiring, and the like. Liquid crystal display device 100 having the above configuration may determine whether data lines 11 of all the groups are normal in each frame, or perform the processing of determining data lines 11 of one group in each frame. The above configuration can similarly be applied to gate line inspection circuit 60 in FIG. 4 and gate line inspection circuit 60 in FIG. 7.

Figure 12:
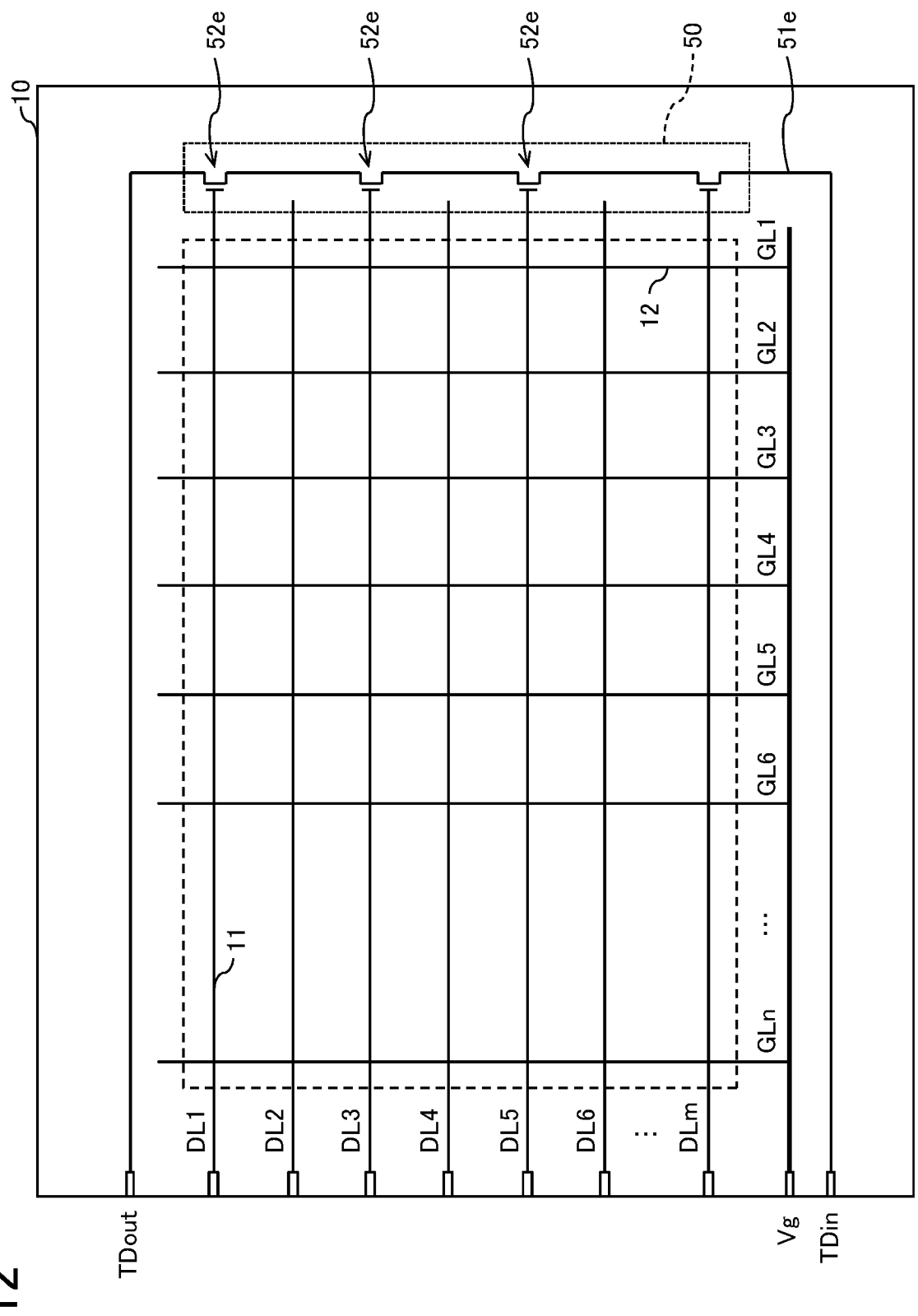
FIG. 12 is a plan view illustrating another configuration of the display panel according to the exemplary embodiment.

FIG. 12 is a plan view illustrating yet another configuration of display panel 10. At this point, data line inspection circuit 50 is illustrated, and gate line inspection circuit 60 is omitted.

In data line inspection circuit 50 of FIG. 12, data line inspection transistors 52e connected to odd-numbered data lines 11 (data lines DL1, DL3, DL5) are connected in series (cascade connection). The data line inspection transistors are not connected to data lines 11 (data lines DL2, DL4, DL6) of even-numbered lines. Data line inspection wiring 51e is connected to data line inspection transistor 52e, and the data line inspection signal TDin is supplied to data line inspection transistor 52e. As described above, the data line inspection transistor need not be connected to all data lines 11. For example, one or a plurality of data line inspection transistors may be provided for each source driver IC. Therefore, a resistance per data line inspection wiring can be decreased.

In the above, the specific embodiments of the present application have been described, but the present application is not limited to the above-mentioned embodiments, and various modifications may be made as appropriate without departing from the spirit of the present application.

What is claimed is:

1. A display device comprising:
a plurality of signal lines arranged in a display region of a display panel;
a plurality of inspection transistors each of which has a drain electrodes, a source electrode and a gate electrode electrically connected to a corresponding one of the plurality of signal lines;
an inspection wiring through which an inspection signal is supplied to the drain electrodes of the plurality of inspection transistors, the inspection wiring including a first inspection wiring and a second inspection wiring; and
an abnormality determination unit that are electrically connected to at least one of the source electrodes of the plurality of inspection transistors and determines whether the display panel is abnormal,
wherein the abnormality determination unit determines whether the display panel is abnormal based on a voltage level of the inspection signal outputted from the at least one of the source electrodes of the plurality of inspection transistors,
the plurality of signal lines are divided into at least a first group including a part of the plurality of signal lines immediately adjacent to each other and a second group including a part of the plurality of signal lines immediately adjacent to each other,
a part of the plurality of inspection transistors have control electrodes respectively and electrically connected to the plurality of signal lines included in the first group, are connected in cascade, and are electrically connected to the first inspection wiring, and
another part of the plurality of inspection transistors have control electrodes respectively and electrically connected to the plurality of signal lines included in the second group, are connected in cascade, and are electrically connected to the second inspection wiring.

2. The display device according to claim 1, wherein
the plurality of signal lines are a plurality of data lines through which image data is supplied to each pixel,
in each of two inspection transistors immediately adjacent to each other in the first group, respective gate electrodes are electrically connected to different data lines, and the source electrode of one of the inspection transistors and the drain electrode of the other inspection transistor are electrically connected to each other, and
in each of two inspection transistors immediately adjacent to each other in the second group, respective gate electrodes are electrically connected to different data lines, and the source electrode of one of the inspection transistors and the drain electrode of the other inspection transistor are electrically connected to each other.

3. The display device according to claim 1, wherein
the plurality of signal lines are a plurality of gate lines through which a gate signal is supplied to a transistor of each pixel.

4. A display device comprising:
a plurality of gate lines arranged in a display area of a display panel;
a plurality of first inspection transistors, each of which has a drain electrode, a source electrode and a gate electrode electrically connected to a corresponding one of the plurality of gate lines;
a plurality of second inspection transistors, each of which has a drain electrode, a source electrode and a gate electrode electrically connected to a corresponding one of the source electrodes of the plurality of first inspection transistors;
a plurality of capacitors, each of which has a first electrode electrically connected to a corresponding one of the source electrodes of the plurality of first inspection transistors and a corresponding one of the gate electrodes of the plurality of second inspection transistors;
an inspection wiring through which an inspection signal is supplied to the drain electrodes of the plurality of first inspection transistors and the drain electrodes of the plurality of second inspection transistors; and
an abnormality determination unit electrically connected to at least one of the source electrodes of the plurality of second inspection transistors and that determines whether the display panel is abnormal, wherein
the abnormality determination unit determines whether the display panel is abnormal based on a voltage level of the inspection signal outputted from the at least one of the source electrodes of the plurality of second inspection transistors.

5. The display device according to claim 4, further comprising a reset line electrically connected to second electrodes of the plurality of capacitors, a reset signal being supplied through the reset line in order to discharge the plurality of capacitors.

6. A method for inspecting a display device,
the display device including:
- a plurality of gate lines arranged in a display area of the display panel;
- a plurality of first inspection transistors each of which has a drain electrode, a source electrode and a gate electrode electrically connected to a corresponding one of the plurality of gate lines;
- a plurality of second inspection transistors each of which has a drain electrode, a source electrode and a gate electrode electrically connected to a corresponding one of the source electrodes of the plurality of first inspection transistors;
- a plurality of capacitors each of which has a first electrode electrically connected to a corresponding one of the source electrodes of the plurality of first inspection transistors and a corresponding one of the gate electrodes of the plurality of second inspection transistors; and
- an inspection wiring through which an inspection signal is supplied to the drain electrodes of the plurality of first inspection transistors and the drain electrodes of the plurality of second inspection transistors, the method comprising the steps of:

supplying sequentially a gate signal to the plurality of gate lines in a writing period and supplying the inspection signal having a voltage level bringing the plurality of second inspection transistors into an on state to the drain electrodes of the plurality of first inspection transistors through the inspection wiring in the writing period;

supplying the inspection signal to the drain electrodes of the plurality of second inspection transistors through the inspection wiring in a vertical flyback period; and determining whether the display panel is abnormal based on a voltage level of the inspection signal outputted from at least one of the source electrode of the second inspection transistor.

7. The method according to claim 6, further comprising the step of supplying a reset signal to second electrodes of the capacitors through a reset line after determining whether the display panel is abnormal in the vertical flyback period.

* * * * *